US010215793B2

(12) United States Patent
Hoff et al.

(10) Patent No.: US 10,215,793 B2
(45) Date of Patent: Feb. 26, 2019

(54) FIBER ALIGNED AND MOTIONALLY COUPLED WITH ELECTRIC CABLE

(71) Applicant: AiQ Dienstleistungen UG (haftungsbeschränkt), Boblingen (DE)

(72) Inventors: Henrik Hoff, Hennef (DE); Alf Clement, Gärtringen (DE)

(73) Assignee: AiQ Dienstleistungen UG (haftungsbeschränkt), Böblingen (DE)

( * ) Notice: Subject to any disclaimer, the term of this patent is extended or adjusted under 35 U.S.C. 154(b) by 150 days.

(21) Appl. No.: 14/945,740

(22) Filed: Nov. 19, 2015

(65) Prior Publication Data

US 2016/0139196 A1    May 19, 2016

(30) Foreign Application Priority Data

Nov. 19, 2014 (DE) ........................ 10 2014 116 908

(51) Int. Cl.
G01R 31/02 (2006.01)
G01R 31/12 (2006.01)

(52) U.S. Cl.
CPC ....... *G01R 31/1218* (2013.01); *G01R 31/021* (2013.01); *G01R 31/1209* (2013.01)

(58) Field of Classification Search
None
See application file for complete search history.

(56) References Cited

U.S. PATENT DOCUMENTS

| 5,386,193 A | 1/1995 | Maeda et al. |
| 2005/0134837 A1 | 6/2005 | Sarkozi et al. |
| 2005/0194979 A1* | 9/2005 | Roman ............... G01R 31/1272 324/536 |
| 2009/0060418 A1* | 3/2009 | Munn .................. G02B 6/3809 385/53 |
| 2009/0102489 A1 | 4/2009 | Lee et al. |
| 2009/0304322 A1* | 12/2009 | Davies ................... G01H 9/004 385/12 |
| 2013/0211726 A1 | 8/2013 | Mestayer et al. |
| 2013/0222811 A1 | 8/2013 | Handerek |
| 2016/0209459 A1* | 7/2016 | Tozzi ..................... G01R 31/14 |

FOREIGN PATENT DOCUMENTS

| DE | 10 2010 061 605 A1 | 6/2012 |
| JP | H05-223883 A | 9/1993 |
| JP | 2000298154 A | 10/2000 |
| JP | 2010085366 A | 4/2010 |

OTHER PUBLICATIONS

References cited in Search Report of German Patent Application.

* cited by examiner

*Primary Examiner* — Shawn Decenzo
(74) *Attorney, Agent, or Firm* — Robert A. Blaha; Smith Tempel Blaha LLC

(57) ABSTRACT

An arrangement having an electric cable, at least one fiber at least a part of which being aligned along and motionally coupled with the electric cable, and a device for detecting effects in the electric cable via said at least one fiber.

22 Claims, 3 Drawing Sheets

FIBER ALIGNED AND MOTIONALLY COUPLED WITH ELECTRIC CABLE

TECHNICAL FIELD

The invention relates to a device for and a method of detecting partial discharge in an electric cable, to an arrangement, to a program element, to a computer-readable medium, and to a method of use.

BACKGROUND

A problem of high voltage power cable systems in ground (for instance operating with a voltage of at least 10 kV, usually above 110 kV or 220 kV up to 500 kV or higher) is the effect of partial discharge which can destroy the electric cable over time.

Conventionally, partial discharge is measured electrically, with different sensor, like current transducers, high frequency probes and ultrasonic acoustic point microphones.

U.S. Pat. No. 5,386,193 discloses a partial discharge detecting device for a resin-molded transformer having no-load switching tap terminals on a high voltage winding thereof. An amplifier amplifies the output detection signal of a partial discharge detecting sensor connected between the tap terminals, and an electro-optic converter converts the output signal of the amplifier into an optical signal. The optical signal is applied through an optical fiber to an opto-electric converter where it is converted into an electrical signal. The electrical signal is applied to an indicator. The partial discharge detecting sensor, the amplifier circuit, and the electro-optic converter are held at a potential corresponding to a potential of the tap terminals.

US 2005/0134837 A1 discloses a cable for detecting partial discharges or arcing in wiring or cables via fiber optics. The cable for detecting partial discharges includes a conductor for carrying electrical signals, at least one fluorescent optical fiber for detecting light generated by a partial discharge, and a first transparent layer surrounding the conductor for supporting the at least one fluorescent optical fiber generally parallel to the conductor. By employing a fluorescent optical fiber, incident light generated by a partial discharge along a length of the optical fiber will be transmitted via the optical fiber to an optical receiver for determining a partial discharge has occurred.

US 2009/0102489 A1 discloses a distributed sensing system for detecting partial electric discharge along the length of an extended object or objects. An optical fiber having a cladding integrated with luminescent material and a silica core of less than 500 micrometers in diameter with a first reflective end deployed in proximity to test objects. A photodetector is positioned at the second end of the optical sensing fiber and receives and measures both a direct emission light from an electric partial discharge event and the reflected emission light from the reflection end of the optical sensing fiber. The measured signals and their arrival times are used to determine the location and magnitude of a partial electrical discharge.

SUMMARY

It is desirable to detect partial discharge early, before it will shorten or destroy the cable and to locate the exact location of the partial discharge event along the cable system.

It is an object of the invention to enable partial discharge detection with a simple construction and a high accuracy.

In order to achieve the object defined above, a device for and a method of detecting partial discharge in an electric cable, an arrangement, a program element, a computer-readable medium, and a method of use according to the independent claims are provided.

According to an exemplary embodiment of the invention, a device for detecting partial discharge in an electric cable is provided, wherein the device comprises an electromagnetic radiation source configured for generating primary electromagnetic radiation to be coupled into at least one fiber (i.e. exactly one fiber or a plurality of fibers, for instance three fibers) at least a part of which being aligned along and motionally, in particular vibrationally, coupled (for instance via air, sand, a cladding of fiber and/or electric cable, etc.) with the electric cable, an electromagnetic radiation detector configured for detecting secondary electromagnetic radiation generated in the fiber in response to the coupling of the primary electromagnetic radiation into the at least one fiber (in which electromagnetic radiation such as light may propagate forwardly and backwardly) and being influenced by partial discharge induced local motion, in particular vibrations, of the electric cable, which local motions, in particular vibrations, couple to the at least one fiber, and a partial discharge determining unit configured for determining information indicative of the partial discharge in the electric cable based on an analysis of the motionally, in particular vibrationally, influenced secondary electromagnetic radiation detected by the electromagnetic radiation detector.

According to another exemplary embodiment of the invention, an arrangement is provided which comprises an electric cable, at least one fiber at least a part of which being aligned along and motionally, in particular vibrationally, coupled with the electric cable, and a device having the above mentioned features for detecting partial discharge in the electric cable via said at least one fiber.

According to another exemplary embodiment of the invention, a method of detecting partial discharge in an electric cable is provided, wherein the method comprises coupling primary electromagnetic radiation into at least one fiber at least a part of which being aligned along and motionally, in particular vibrationally, coupled with the electric cable, detecting secondary electromagnetic radiation generated in the at least one fiber in response to the coupling of the primary electromagnetic radiation into the at least one fiber and being influenced by partial discharge induced local motions, in particular vibrations, of the electric cable, which local motions, in particular vibrations, couple to the at least one fiber, and determining information indicative of the partial discharge in the electric cable based on an analysis of the motionally, in particular vibrationally, influenced detected secondary electromagnetic radiation.

OVERVIEW OF EMBODIMENTS

According to yet another exemplary embodiment of the invention, at least one of Distributed Acoustic Sensing (DAS) and Distributed Vibration Sensing (DVS) is used for detecting partial discharge of an electric cable by analyzing an influence of partial discharge induced local motions, in particular vibrations, on electromagnetic radiation in at least one fiber at least a part of which being aligned along and motionally, in particular vibrationally, coupled to the electric cable.

According to still another exemplary embodiment of the invention, a program element, e.g. of detecting partial discharge of an electric cable, (for instance a software routine, in source code or in executable code) is provided, which, when being executed by a processor (such as a microprocessor or a CPU), is adapted to control or carry out a method having the above mentioned features.

According to yet another exemplary embodiment of the invention, a computer-readable medium (for instance a CD, a DVD, a USB stick, a floppy disk or a harddisk) is provided, in which a computer program, e.g. of detecting partial discharge of an electric cable, is stored which, when being executed by a processor (such as a microprocessor or a CPU), is adapted to control or carry out a method having the above mentioned features.

Data processing which may be performed according to embodiments of the invention can be realized by a computer program, that is by software, or by using one or more special electronic optimization circuits, that is in hardware, or in hybrid form, that is by means of software components and hardware components.

In the context of the present application, the term "partial discharge determining unit" may particularly denote a processor (such as a microprocessor or a central processing unit, CPU) or part thereof capable of determining the information indicative of the partial discharge based on an analysis of the detected signal. Such a partial discharge determining unit may also act as a control unit for controlling overall operation of the device.

In the context of the present application, the term "partial discharge" may particularly denote a phenomenon in an electric cable in which an electric current propagating through the electric cable experiences distortions due to mechanical damages between electrically conductive core and electrically insulating cladding of the electric cable, as well as of voids of the electric cable. When only very few and rare events of partial discharge occur in an electric cable, this is not harmful and still acceptable. However, if the intensity and number of partial discharge events in an electric cable increases, the electric cable needs maintenance or replacement by a new electric cable. According to an exemplary embodiment of the invention, the fact is used that partial discharge events in an electric cable also generate motional distortions (in particular vibrational or acoustical distortions) in a direct surrounding of the electric cable. Hence, by aligning an optical fiber with the electric cable and by vibrationally coupling the electric cable with the optical fiber by an intimate or snugly fitting mechanical link between them, it is possible to couple mechanical or structural distortions as a consequence of a partial discharge event in the electric cable also into an assigned portion of the optical fiber. By injecting primary electromagnetic radiation into the optical fiber and sampling secondary electromagnetic radiation (which can be backscattered primary electromagnetic radiation, and/or which can experience propagation influence forward and interference at the ends) also being characteristically influenced by partial discharge induced mechanical/structural distortions of the fiber, information characterizing the intensity and/or frequentness of the electric partial discharge events can be determined. Thus, the danger of upcoming failure of the electric cable can be detected in due time so as to allow a technician to replace the electric cable or sections thereof, or to carry out repair actions, when such partial discharge events become an issue.

The term "electric cable" may particularly denote an at least partially electrically conductive cable configured for carrying and conducting an electric current. The electrically conductive portion of the electric cable may for instance be made of a metal.

The term "fiber" may particularly denote a member (in particular an optoelectronic member) capable of guiding electromagnetic radiation to propagate along a defined path through the fiber. A fiber made for instance of fused silica glass may be capable for transporting visible and infrared radiation. Hence, a fiber may be denoted as a dielectric waveguide at least partially transparent for electromagnetic radiation.

The term "motionally coupled" may particularly denote the fact that the electric cable and the fiber are mechanically coupled sufficiently rigidly so that local motions of sections of the electric cable have a direct mechanical input to the fiber so that a corresponding section of the latter follows the mechanical motion of the electric cable. Such a mechanical coupling between the electric cable and the fiber should be fix and durable so that the mechanical coupling is maintained in all operation modes of the arrangement even under harsh conditions. In particular, a motion of the electric cable without the fiber, or vice versa, shall be disabled in the sensor region. Thus, the electric cable is preferably intimately connected with the optical fiber.

The term "local motion" may particularly denote a motion of a short sub portion of the electric cable relative to the rest of the electric cable as an impact of a partial discharge event occurring in this sub portion. For example, such a local motion may be a temporary bending of a portion of the cable experiencing a temporary force due to the partial discharge event. However, such a local motion may also be an oscillatory motion of this sub portion of the electric cable, for instance a vibration, in particular an acoustic wave such as sound.

The term "electromagnetic radiation" may particularly denote photons of a suitable wavelength capable of propagating through a fiber. Optical radiation may be in a range between 400 nm and 800 nm, i.e. may be in the visible region. Infrared radiation usable for partial discharge detection may be in a range between 800 nm and 5000 nm. For instance, 1550 nm is a suitable measurement wavelength.

Exemplary embodiments are based on the consideration that also mechanical (in particular vibrational) forces can affect fibers (such as glass fibers, for example made of quartz, in particular doped quartz glass) and are capable of locally changing the characteristics of light transmission in the fiber. As a result of the modification of the light in the fibers through scattering and related effects, the location of an external physical effect such as partial discharge in a direct environment (i.e. the vibrationally coupled electric cable) can be determined so that the fiber can be employed as a vibration-sensitive (in particular linear) sensor. Hence, partial discharge generates a mechanical (in particular an acoustic) distortion in the electric cable which is mechanically (in particular acoustically) coupled onto the fiber. The latter coupling can then be detected by measuring the impact of such structural distortions on electromagnetic radiation propagating through the fiber. In other words, the structural distortion of the electric cable due to partial discharge results in a structural distortion of the fiber as a consequence of the rigid motional coupling between cable and fiber. This local structural distortion of the fiber, in turn, has an impact on the electromagnetic wave propagating through the fiber, which is used as a detection signal. Thus, spatially resolved information with regard to partial discharge may be detected (for instance when pulses of electromagnetic radiation are injected as probes into the fiber, and a time of flight measurement allows to assign a certain part of the secondary electromagnetic radiation to a corresponding spatial section of the fiber and hence an assigned spatial section of the electric cable).

In the following, further exemplary embodiments of the device, the method, the arrangement, the program element, the computer-readable medium, and the method of use will be explained.

In an embodiment, the partial discharge determining unit is configured for determining spatially resolved information indicative of the partial discharge at a certain cable position of the electric cable based on an identification of a certain fiber position of the fiber to which a detected portion of the secondary electromagnetic radiation belongs and based on predetermined mapping information mapping cable positions to fiber positions. For instance, a time of flight measurement can be applied when the primary electromagnetic radiation is injected into the fiber in the form of pulses. With such a time of flight measurement, each portion of the secondary electromagnetic radiation can be assigned to a corresponding fiber position at which this portion has been backscattered, when DTS is applied. When however DVS is applied, an interference signal may be used. It can therefore be identified at which position of the fiber the partial discharge event has occurred. When additionally mapping information is available which assigns each fiber position to a corresponding cable position, the section of the cable can also be identified at which the partial discharge event has occurred. When a single fiber is used to serve different cables or different cable sections (which may be for instance aligned parallel to one another, for instance in the scenario of a multiphase cable), this mapping may also consider a reversed alignment of part of the fiber. This can be advantageously reflected in the mapping information (see FIG. 4 and FIG. 5). For example, the mapping information may be stored as a mapping table.

In an embodiment, the electric cable is a high voltage power cable (for instance operating with a voltage of at least 10 kV, usually above 110 kV or 220 kV up to 500 kV) arranged or to be arranged in ground (in particular configured as buried cable or underground cable). For such power cables, the knowledge of information indicative of partial discharge is of particular importance, since such kind of cables are particularly prone to damage in view of partial discharge. At the same time, the knowledge of a certain cable position at which partial discharge problems occur are of utmost importance, since repair or replacement of the damaged section of the electric cable requires to dig out the electric cable from the ground. Advantageously, an exemplary embodiments provides all these pieces of information.

In one embodiment, an arrangement is provided comprising a (in particular Distributed Acoustic Sensing, DAS, or DVS, Distributed Vibration Sensing) device with a sensor embodied as one fiber. In another embodiment, an arrangement is provided comprising a (in particular DAS or DVS) device with a sensor comprising or consisting of multiple (in particular three) fibers.

In an embodiment, the device is configured for detecting the partial discharge in the electric cable by Distributed Acoustic Sensing (DAS). Sound generated by partial discharge events at corresponding positions of the electric cable can be acoustically detected by DAS. Such a DAS measurement apparatus is particularly suitable to detect, locate, monitor and analyze partial discharge in electric power cables. DAS allows to measure directly the acoustic signal at any point along the sensor fiber. The frequency components of the acoustic signal are only limited due to a limited sampling rate (typically up to 1 kHz to 10 kHz, up to 100 kHz or much higher) which depends on the sensor fiber length. The acoustic signals may be measured by the DAS with a repetition of 1000 measurements for a 100 km fiber to 10000 measurements per second for 10 km and analyzed for partial discharge events. The repetition depends on the length of the total optical fiber. The higher the repetition, the better is the time resolution, when the partial discharge occurs in relation to the electrical phase. When the electrical signal follows a 50 Hz/60 Hz frequency, one period is 20 ms/16.67 ms. A resolution of 1 ms is enough to get a good position accuracy of the event relative to the electrical phase. DAS may be carried out with a single-mode fiber or with a multi-mode fiber. A DAS measurement system may operate with a single fiber having an open end and being operated from one side only.

In an embodiment, the device is configured for detecting the partial discharge in the electric cable by Distributed Vibration Sensing (DVS). Also such a DVS measurement apparatus is particularly suitable to detect, locate, monitor and analyze partial discharge in electric power cables. Hence, the vibration induced by the partial discharge event in the electric cable and transferred to the optical fiber can be detected by DVS. DVS works interferometrically and is able to detect acoustic signals with ultrasonic frequencies of up to 500 kHz and more (for instance up to the MHz range) with high accuracy. DVS can be carried out by performing a continuous measurement (i.e. without the concept of a repetition rate). DVS can operate for example with a sample rate of up to 100 MHz or even into the GHz range. DVS may be carried out with a single-mode fiber or with a multi-mode fiber. A DVS system may operate with three fibers which can be coupled in a loop arrangement (in particular implementing one of the fibers as a back fiber, and the other two fibers in an interferometric arrangement, compare FIG. 3).

In an embodiment, the DAS or DVS system measures the cable system from one side only by using an embedded optical fiber as a sensor. More specifically, the electromagnetic radiation source and the electromagnetic radiation detector as well as the partial discharge determining unit may all be located adjacent to one end of the fiber and may measure the secondary electromagnetic radiation as backscatter result of the primary electromagnetic radiation. This allows for a compact design and a simple construction, since only one end of the fiber needs to be accessible for the detection.

In an embodiment, the device comprises a temperature information determining unit configured for determining temperature information along an extension of the cable, in particular by Distributed Temperature Sensing (DTS). Hence, the temperature information may be derived based on an analysis of secondary electromagnetic radiation detected by the electromagnetic radiation detector in response to primary electromagnetic radiation to be coupled into a fiber at least a part of which being aligned along the electric cable. In the context of this application, the term "distributed temperature sensing" may particularly denote a mechanism of determining a temperature distribution along an extension of an optical fiber. For that purpose, pulses of electromagnetic radiation such as light or infrared radiation may be injected into the fiber for interaction with the fiber. In dependence of the local temperature at the specific portions of a fiber, the radiation-matter interaction properties and the phonon generation/annihilation properties of this portion of the fiber will be modified characteristically, and a pattern of scattered electromagnetic radiation may be detected at a detector in a manner which is characteristic for the temperature distribution. Thus, by analyzing the scattered electromagnetic radiation, it is possible to derive information indicative of the temperature distribution along the waveguide, and in view of the intimate motional coupling between fiber and cable, this temperature information can also be assigned to the cable.

In particular a combination of a DTS measurement on the one hand and a DAS or DVS measurement on the other hand on a high voltage cable system provides significant advantages. It is advantageously possible to synergetically combine the DAS or DVS based partial discharge detection with a DTS temperature sensing architecture so that in addition to the detection of partial discharge a temperature distribution along the optical fiber may be estimated. This may provide complementary information so as to enable a user to obtain a deeper insight in the effects within the electric cable.

In an embodiment the device, further comprises an alarm unit for providing an alarm based on the information indicative of the partial discharge. The information indicative of the partial discharge may be based on an analysis of the detected signal, wherein the partial discharge determining unit may detect the signal. For example, the processing of the signal may be based on absolute values of signal parameters or based on a rate of change in the detected or measured value of the signal parameter. In particular, the given alarm may be an absolute alarm value (i.e. and the measured value of the signal parameter may be greater than a given alarm threshold) or may be a rate of change of the measured value (i.e. the measurement value of the signal parameter increased more than a given alarm threshold within a predefined time interval). More in particular, the alarm may be based on at least one of the following signal parameters of the determined information: an amplitude, a distance, a width, a density, and a confidence value.

In an embodiment, at least part of the fiber used for determining information indicative of the partial discharge and at least part of the fiber used for determining the temperature information are identical. Hence, one and the same physical fiber or fiber section may be used as a probe for both partial discharge events as well as temperature events. Therefore, a compact design of the device may be accomplished. In such an embodiment, the measurement of the partial discharge events on the one hand and of the temperature information on the other hand may be carried out subsequently or sequentially. In order to measure both partial discharge events and temperature information simultaneously, the use of multiple parallel fibers is preferable.

In an embodiment, the device comprises an ampacity rating unit configured for rating ampacity of the electric cable based on the determined temperature information along the cable. When the temperature distribution is known along the fiber and the cable, this allows to derive information indicative of the ampacity of the cable. Hence, this information may provide a meaningful insight into the ampacity behavior of the electric cable. In particular optical single-mode fibers may be used for communication networks, but may also be used as sensors for instance for temperature monitoring along the cable by DTS. The temperature measurement may be used to calculate the conductor temperature for ampacity ratings of the cable in a power cable management system.

In an embodiment, the partial discharge determining unit is configured for determining the information indicative of the partial discharge exclusively considering the influence of the partial discharge induced local motion (such as vibrations), in particular regardless of electromagnetic radiation which may be generated in or around the electric cable due to partial discharge. Therefore, all electromagnetic radiation which may also be generated by partial discharge events may be actively prevented from coupling into the optical fiber because this might influence the electromagnetic probe radiation introduced into the fiber for detecting partial discharge based structural distortions. Hence, exemplary embodiments may shield such partial discharge induced electromagnetic radiation from propagating into the fiber in order to obtain a high accuracy. In particular when identifying partial discharge events by pattern recognition, undisturbed secondary electromagnetic radiation is required. It is then particularly advantageous to suppress any influence of electromagnetic radiation generated by partial discharge, in order to obtain a high accuracy.

In particular, the device or the arrangement may comprise a shielding provision for shielding the fiber so as to disable electromagnetic radiation generated in the electric cable by partial discharge from propagating into the fiber. Particularly, the shielding provision comprises a cladding circumferentially surrounding at least one of the electric cable and the fiber and being opaque for the electromagnetic radiation. This provision has the advantage that the accuracy of the detection of the partial discharge events by an analysis of electromagnetic radiation probes coupled into the fiber is prevented from being deteriorated from electromagnetic radiation generated by the partial discharge event as well. Preventing the latter electromagnetic radiation from propagating into the optical fiber makes a difficult distinction between the different kinds of electromagnetic radiations with different patterns in the detection signals dispensable and therefore increases the precision of the results in terms of the information concerning partial discharge.

More specifically, the shielding provision may be specifically configured for disabling electromagnetic radiation generated at the electric cable during the partial discharge event and having a frequency at (and/or around, for instance ±10% around) a measurement frequency of the primary electromagnetic radiation injected into the fiber from propagating into the fiber. For instance, when the measurement frequency (i.e. the frequency of the primary electromagnetic radiation) is 1550 nm, the shielding provision can be made selectively intransparent at this frequency and in a range around it (for instance in the near infrared region). While electromagnetic radiation generated during partial discharge and having frequency values being far apart from the measurement frequency of the primary electromagnetic radiation are not disturbing for the fiber-based measurement and need not necessarily be prevented from propagating into the fiber, partial discharge induced electromagnetic radiation close to the measurement frequency has a significantly larger capability of disturbing the partial discharge determination and can be therefore selectively shielded from the measurement fiber by an intransparent cladding or the like.

In an embodiment, the partial discharge determining unit is configured for determining positional information indicative of a position along the electric cable at which the partial discharge event has occurred. Thus, spatially resolved information with regard to the partial discharge event may be determined. This may for instance be determined based on flight of time measurements of the primary electromagnetic radiation which is converted into secondary electromagnetic radiation by the occurrence of partial discharge events. Thus, a partial discharge peak at a certain position in a long electric cable, for instance running parallel to a pipeline or through a tunnel, or transmitting data or electric energy buried into the earth, may be precisely located so that individual sections of the electric cable which need to be exchanged may be precisely located with this information. This significantly simplifies the identification of one or more harmed portions of the electric cable.

In an embodiment, the partial discharge determining unit is configured for determining the information indicative of the partial discharge based on a pattern analysis of one or more features of the secondary electromagnetic radiation. In such an embodiment, preknown, premeasured or premodeled patterns of signal features of the secondary electromagnetic radiation in the event of partial discharge may be compared, by pattern recognition procedures, with features of the detection signal. Therefore, even a noisy signal may still be successfully evaluated. Pattern recognition in terms of partial discharge determination significantly improves reliability and reproducibility of the measurement results.

In an embodiment, the partial discharge determining unit is configured for determining information indicative of a time distance between subsequent partial discharge events at a certain position of the electric cable and the fiber. It has turned out as a meaningful measure for the degree of danger of a complete damage of the electric cable how frequently partial discharge events occur at a certain position in the time domain. Therefore, an average time distance between two subsequent partial discharge events may be determined in a spatially resolved manner.

In an embodiment, the partial discharge determining unit is configured for determining information indicative of a time duration of a partial discharge event at a certain position of the electric cable and the fiber. It has also been found that the duration of a single partial discharge event provides meaningful information with regard to the degree of danger that the electric cable will fail soon at a certain spatial position.

In an embodiment, the device comprises a decision unit configured for taking and outputting a decision depending on the determined time distance and/or the determined time duration, highly preferably depending on a combination of both. For example, preknown or predetermined or premodeled information about a probability of a potential failure of the electric cable in dependence of the distance between subsequent partial discharge events and the duration of a partial discharge event in the time domain may be compared with presently obtained data. Based on this, a decision may be taken which consequence detected partial discharge events should have. For instance, when the determined information regarding partial discharge falls in a first category (for instance time duration is below a certain threshold value and/or time distance is above a certain threshold value), the decision may be that no action is taken since the electric cable is still usable. When the determined information regarding partial discharge falls in a second category (for instance time duration is above the above-mentioned threshold value but below a certain other threshold value and/or time distance is below the above-mentioned threshold value but above a certain other threshold value), the decision may be that a warning is output indicating that the electric cable is still usable but approaches a critical state. When the determined information regarding partial discharge falls in a third category (for instance time duration is above the above-mentioned other threshold value and/or time distance is below the above-mentioned other certain threshold value), the decision may be that a system implementing the electric cable is automatically switched off for safety reasons.

In an embodiment, the fiber is provided separately from the electric cable. Hence, electric cable and the optical fiber may be separable and separate components which can be assembled, disassembled or replaced separately from one another. Such an optical fiber may be equipped with a coupling provision configured for intimately coupling the optical fiber to the electric cable during partial discharge detection. By taking this measure, an optical fiber having optimum properties for a certain electric cable may be used and selected. This embodiment also allows retrofitting an already existing electric cable with a partial discharge detection facility.

In another embodiment, both the fiber and the electric cable are embedded within a common sheathing. According to such a highly preferred embodiment, electric cable and optical fiber form an integral structure, for instance form part of a larger cable arrangement. Such a cable arrangement may have an outer shell, for instance of plastic, in which at least the electric cable and the optical fiber, optionally further electric and/or electrooptical components, may be embedded. For instance, such an integral structure may be buried in the earth so as to transmit data and/or energy over large distances. In such an embodiment, the electrically current transporting electric cable is anyway equipped with an optical fiber which can be synergetically used also for determining the partial discharge information. For instance, an electric high voltage power cable may be manufactured with multiple optical fibers embedded in the outer insulation or attached to the cable or placed in the center of a trefoil or other cable configurations. Thus, integrally formed cables can be used, without significant additional hardware effort, as a sensor fiber for detecting partial discharge. Such an integrated cable arrangement with integrally formed electric cable and fiber already provides the intimate contact between electric cable and fiber which is highly advantageous for a precise motion transfer from electric cable into the fiber.

In an embodiment, the fiber is acoustically coupled with the electric cable. Acoustically coupled in this context means that acoustic waves are enabled from propagating from the electric cable into the optical fiber. Acoustic waves may denote longitudinal mechanical waves. In particular, acoustic waves may be mechanical waves in an audible wavelength range, i.e. sound. Sound generated at and around an electric cable in response to a partial discharge event has turned out as a specifically accurately fiber-detectable signal for determining partial discharge information with high accuracy.

In an embodiment, the fiber is a single mode fiber. It has turned out that single-mode fibers provide better results in terms of detecting information concerning partial discharge in an electric cable than multi-mode fibers.

In an embodiment, the electric cable is a multi-phase cable having multiple sub cables each assigned to a respective phase, and multiple fibers are provided, wherein at least a part of each of the multiple fibers is aligned along a respective one of the sub cables. For instance, the electric cable may comprise three phases, and for each phase a corresponding optical fiber is provided for monitoring partial discharge events.

In another embodiment, the electric cable is a multi-phase cable having multiple sub cables each assigned to a respective phase, and a single fiber is provided, wherein each of multiple sections of the single fiber is aligned along a respective one of the sub cables. The term "section of the fiber" may particularly denote a physical portion of the fiber along which the electromagnetic radiation may propagate. For instance, the electric cable may comprise three phases, and for each phase a corresponding section of one and the same optical fiber is provided for monitoring partial discharge events. This provides for a particularly compact construction of the arrangement and a high robustness against failure.

The aspects defined above and further aspects of the invention are apparent from the examples of embodiment to be described hereinafter and are explained with reference to these examples of embodiment.

The invention will be described in more detail hereinafter with reference to examples of embodiment but to which the invention is not limited.

BRIEF DESCRIPTION OF THE DRAWINGS

The illustration in the drawing is schematically. In different drawings, similar or identical elements are provided with the same reference signs.

DETAILED DESCRIPTION OF ILLUSTRATED EMBODIMENTS

Figure 1:
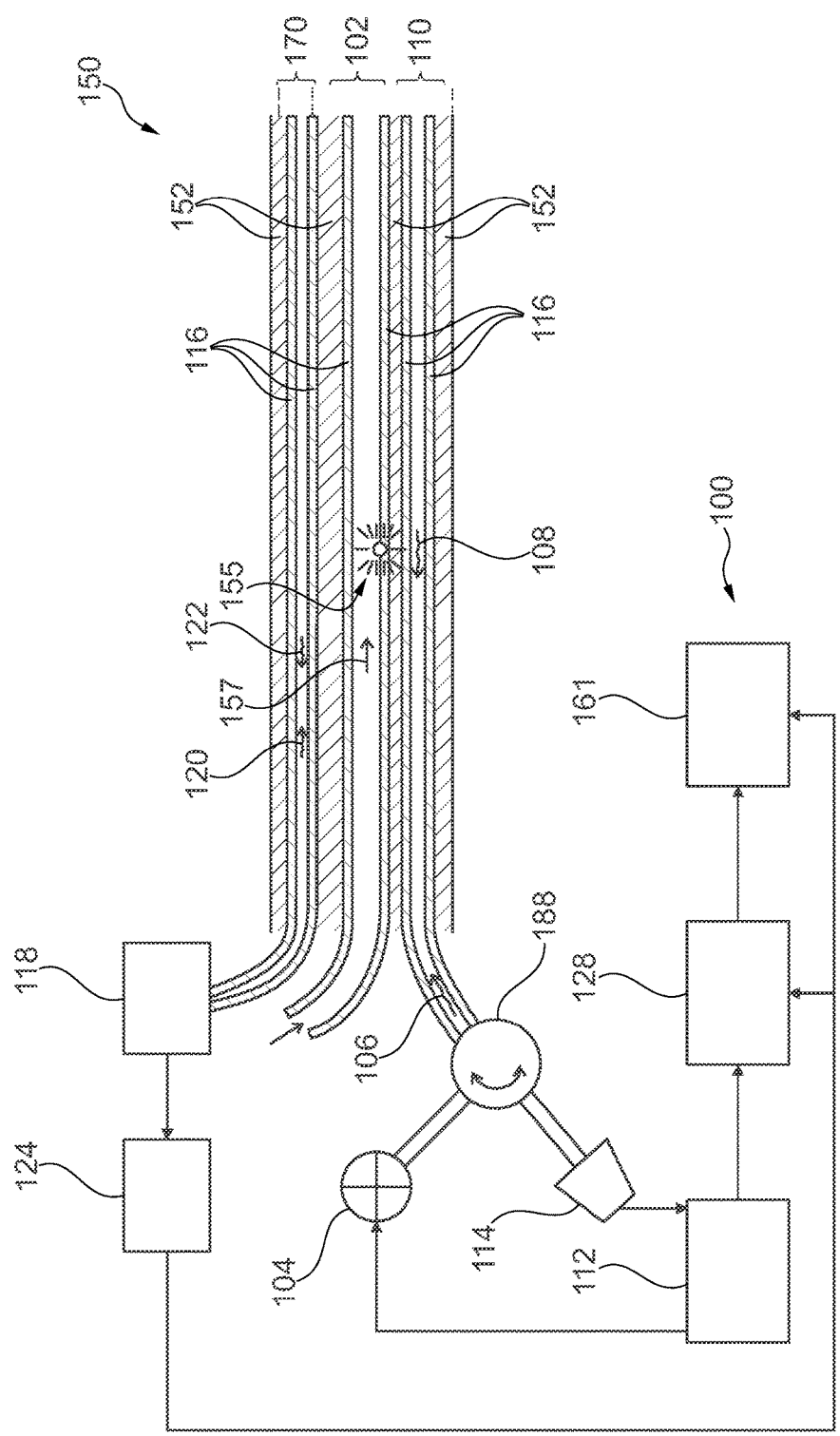
FIG. 1, FIG. 2, FIG. 3, FIG. 4 and FIG. 5 illustrate arrangements with a device for a fiber-based detection of partial discharge in an electric cable according to exemplary embodiment of the invention.

FIG. 1 illustrates an arrangement 150 comprising a device 100 for detecting partial discharge in an electric cable 102 according to exemplary embodiment of the invention.

In addition to the device 100, the arrangement 150 comprises the electric cable 102 (here embodied as a power cable) and a fiber 110 (here embodied as a waveguide, in particular an optical single-mode fiber) being aligned along and being vibrationally coupled with the electric cable 102. This means that any vibrations occurring at a section of the electric cable 102 immediately results in a corresponding vibration of a juxtaposed section of the fiber 110 which is aligned to the vibrating section of the electric cable 102. For this purpose, it is ensured that the electric cable 102 and the fiber 110 are mechanically rigidly coupled to one another but are at the same time free for vibrating or performing another kind of motion in response to a corresponding vibration or motion stimulus. Both the fiber 110 and the electric cable 102 are advantageously embedded within a common sheathing 152 so as to form an integral cable suitable for instance as a ground cable. Hence, a user has to handle only a single component, and at the same time durable maintenance of the motional coupling between fiber 110 an electric cable 102 is ensured, which in turn ensures a high accuracy of the partial discharge detection.

The device 100 comprises an electromagnetic radiation source 104 (here embodied as a laser) configured for generating monochromatic coherent primary electromagnetic radiation 106 (for instance optical light) to be coupled into the fiber 110. In particular, the electromagnetic radiation source 104 can be controlled by a control unit, which is here embodied as partial discharge determining unit 112, to emit the primary electromagnetic radiation 106 in accordance with a predefined characteristic, for instance in the form of subsequent pulses. When the generated primary electromagnetic radiation 106 is injected into the fiber 110 in a corresponding switching state of an optical switch 188, it propagates through the fiber 110 and experiences interaction with the fiber 110 so that the primary electromagnetic radiation 106 is scattered. Backscattering of the primary electromagnetic radiation 106 results in a propagation of correspondingly generated secondary electromagnetic radiation 108 in the opposite direction, i.e. back towards the optical switch 188 (which preferably has a short switching time). As an alternative to the optical switch 188, it is also possible and in some embodiments preferable to implement a circulator (see reference numeral 204 in FIG. 2) which is capable, at the same time, to forward electromagnetic radiation from the electromagnetic radiation source 104 into the fiber 110, and from the fiber 110 towards the electromagnetic radiation detector 114. Also a wave division multiplexer (WDM), which is not shown, may be used (i.e. a coupler that enables to channel a signal to multiple devices operating at different wavelengths).

As will be described below in more detail, also vibrations and other kind of motion of the optical fiber 110 have an influence on the characteristic of the secondary electromagnetic radiation 108. In a corresponding switching state of the optical switch 188, the secondary electromagnetic radiation 108 being characteristically manipulated by vibrations (in particular those resulting from partial discharge events in the electric cable 102) can be detected by an electromagnetic radiation detector 114 (such as a photodiode). The electromagnetic radiation detector 114 is hence configured for detecting secondary electromagnetic radiation 108 generated in the fiber 110 in response to the coupling of the primary electromagnetic radiation 106 into the fiber 110 and being influenced by partial discharge induced vibrations in the electric cable 102, which vibrations couple to the fiber 110 as a consequence of the rigid but mutually movable fiber-cable assembly.

Partial discharge determining unit 112, embodied for instance as processor, is configured for determining information indicative of partial discharge which may occur in the electric cable 102 based on an analysis of the vibrationally influenced secondary electromagnetic radiation 108 detected by the electromagnetic radiation detector 114.

Both the electric cable 102 and the fiber 110 comprises a respective cladding 116 which is optically transparent or opaque for electromagnetic radiation, at least in the range of wavelengths in which the electromagnetic radiation detector 114 is sensitive. The reason for this is that any artificial electromagnetic radiation which may be generated by a partial discharge event (see reference numeral 155) in the electric cable 102 cannot propagate through the opaque (more precisely opaque at the measurement wavelength, i.e. the wavelength of the primary electromagnetic radiation 106) claddings 116 into fiber 110 and is therefore prevented from influencing the signal detected by the electromagnetic radiation detector 114. Although the origin of such electromagnetic radiation is also a partial discharge event to be detected, i.e. a partial discharge event in the electric cable 102, the pattern of such electromagnetic radiation may be different from a pattern in the secondary electromagnetic radiation 108 which pattern results from a vibrational impact of a partial discharge event in the electric cable 102 on the fiber 110. Hence, the opaque claddings 116 increase accuracy and reliability of the partial discharge detection.

The partial discharge determining unit 112 is configured for determining the information indicative of the partial discharge based on a pattern analysis of features of the secondary electromagnetic radiation 108. For this purpose, the secondary electromagnetic radiation 108 may be analyzed for identifying the presence or absence of certain pre-known characteristics or features (i.e. patterns) of detected electromagnetic radiation in the presence of a partial discharge event. Such a pattern recognition may comprise the identification of expected shapes of parts of the detection signal which may be assigned to a partial discharge event. However, such a pattern recognition may comprise additionally or alternatively the identification of certain parameters from the detection signal which may include also valuable information in terms of partial discharge. Such parameters may include, for example, a characteristic (for instance average) time interval between two subsequent partial discharge events at a certain position of the fiber 110 and/or a duration of a certain partial discharge event (see in particular FIG. 6).

The device 100 furthermore comprises a temperature information determining unit 118 configured for determining temperature information along an extension of the electric cable 102 by Distributed Temperature Sensing (DTS) based on an analysis of further secondary electromagnetic radiation 122 detected in response to further primary electromagnetic radiation 120 to be coupled into a further fiber 170 being aligned along the electric cable 102 as well. In the shown embodiment, the further fiber 170 is different from the fiber 110 so that the determination of temperature information via the further fiber 170 and the determination of partial discharge related information via the fiber 110 may be performed simultaneously and without any risk of undesired crosstalk. In order to obtain a particular compact arrangement 150, it is however alternatively also possible to use one and the same fiber 110 both for the partial discharge detection as well as for the temperature detection.

The device 100 furthermore comprises an ampacity rating unit 124 configured for rating ampacity of the electric cable 102 based on the determined temperature information along the electric cable 102. Such an ampacity rating unit 124 allows to extend the functionality of the arrangement 150 to a power cable monitoring system.

The device 100 moreover comprises a decision unit 128 configured for taking (and outputting to an input/output unit 161) a decision depending on the result of the partial discharge information determination. Such a decision may be a warning to a user that the electric cable 102 should be exchanged partially or as a whole in view of an accumulation of partial discharge events. Another decision may be a deactivation of a technical system (such as an energy transmission system or a data transmission system) comprising the electric cable 102 when the partial discharge events have reached such an intensity that there is a concrete danger of failure of the technical system.

Operation of the arrangement 150 according to FIG. 1 is as follows: An electric current 157 flows through an electrically conductive core of the electric cable 102. As indicated by reference numeral 155, it may happen that partial discharge events 155 occur along the electric cable 102, in particular shortly before the lifetime of the electric cable 102 ends. The partial discharge event 155 induces vibration (including acoustic vibration) and generation of electromagnetic radiation, in particular light. Due to the opaque or non-transparent property of the cladding 116 of both the electric cable 102 and the optical fiber 110, the generated electromagnetic radiation is inhibited from propagating into the optical fiber 110. However, the vibrations or acoustic waves may couple into the optical fiber 110 thanks to the motional coupling between electric cable 102 and fiber 110 which starts oscillating and is made subject to acoustic waves. The primary electromagnetic radiation 106 coupled into the optical fiber 110 is influenced by these vibrations and/or acoustic waves which are coupled into the fiber 110 as a consequence of the intimate contact between electric cable 102 and optical fiber 110. Therefore, secondary electromagnetic radiation 108 propagating through the fiber 110 results from an interaction between the primary electromagnetic radiation 106 and the induced vibrations/acoustic waves. After reflection/back-scattering of the electromagnetic radiation, and upon switching the optical switch 188, the electromagnetic radiation detector 114 detects the secondary electromagnetic radiation 108. Based on the above-described pattern recognition, signal patterns which go back to the partial discharge event 155 are identified by the partial discharge determining unit 112. At the same time, the distributed temperature information determining unit 118 determines the temperature distribution along the length of the electric cable 102 and provides this information to decision unit 128.

When the primary electromagnetic radiation 106 is injected into the optical fiber 110 in the form of pulses, spatially resolved information concerning the location at which a partial discharge event occurs may be derived. Depending on a time of flight calculation of a time of flight of electromagnetic radiation between being injected into the fiber 110 as primary electromagnetic radiation 106 and the detection of a certain portion of the secondary electromagnetic radiation 108 by the electromagnetic radiation detector 114, it can be decided at which part/position of the fiber 110 the respective portion has been backscattered. When such a portion includes a pattern indicative of a partial discharge event, it can be concluded that the partial discharge event has occurred at the determinable position at which the portion has been backscattered.

Figure 2:
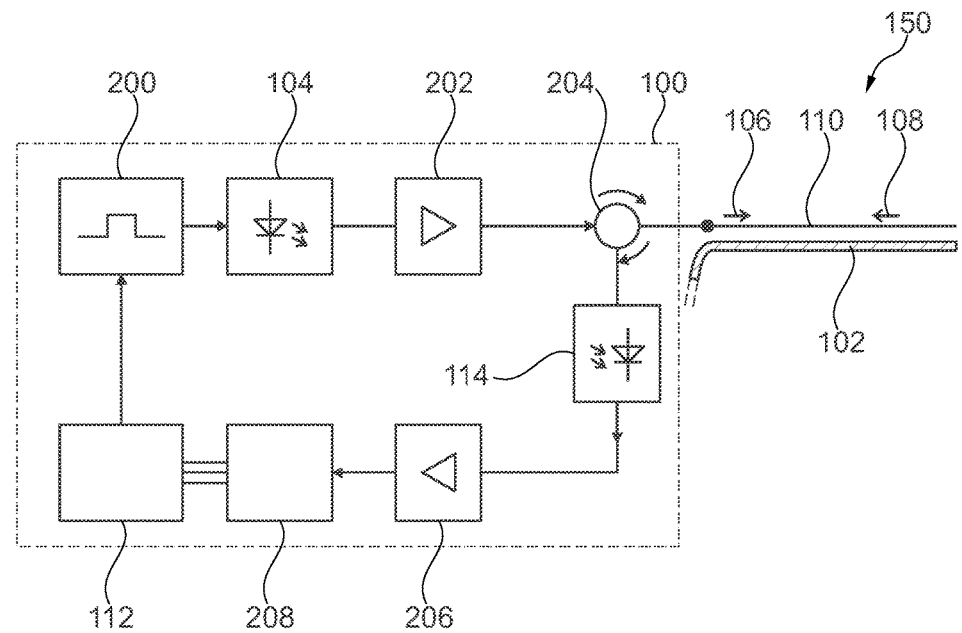

FIG. 2 illustrates an arrangement 150 with a device 100 for detecting partial discharge in an electric cable 102 by Distributed Acoustic Sensing (DAS) according to exemplary embodiment of the invention.

In the embodiment of FIG. 2, a pulse generator 200 is controlled by partial discharge determining unit 112 to generate pulses which, in turn, are used for controlling an electromagnetic radiation source 104, here embodied as a laser diode, to emit pulses of electromagnetic radiation. These pulses are amplified in an optical amplifier unit 202 (which may be embodied as an erbium doped fiber amplifier, EDFA) and are coupled, via an optical circulator or switch 204, as primary electromagnetic radiation 106 into the optical fiber 110 acting as sensor fiber. Also a wave division multiplexer (WDM) may be implemented apart from such a circulator. Propagation of the primary electromagnetic radiation 106 through the optical fiber 110 causes, by scattering and related effects, generation of secondary electromagnetic radiation 108 propagating backwardly through the optical fiber 110. The secondary electromagnetic radiation 108 is guided, in an appropriate switching position of the optical switch 204, towards an electromagnetic radiation detector 114, for example embodied as a photodiode (such as a positive intrinsic negative (PIN) diode or an avalanche photodiode, APD). In the electromagnetic radiation detector 114, the optical signal is converted into an electrical signal which is subsequently amplified by an amplifier 206. An analog to digital converter 208 converts the analog electric signal output by the amplifier 206 into a digital signal. The partial discharge determining unit 112, based on its control signal supplied to the pulse generating unit 200 and based on the digital detection signal received from the analog to digital converter 208, then generates information indicative of the partial discharge.

Figure 3:
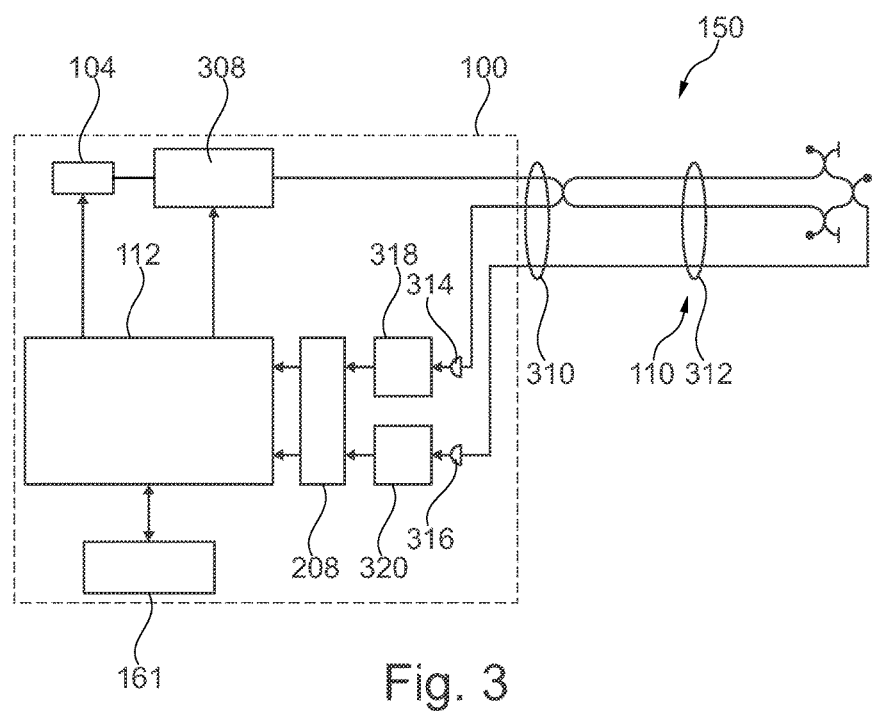

FIG. 3 illustrates an arrangement 150 with a device 100 for detecting partial discharge in an electric cable 102 by Distributed Vibration Sensing (DVS) according to another exemplary embodiment of the invention.

Partial discharge determining unit 112 (which may be embodied as an FPGA, field programmable gate array) controls electromagnetic radiation source 104, such as a laser, to emit electromagnetic radiation which is manipulated in a polarization scrambler 308. The manipulated electromagnetic radiation is then injected into optical fiber 110. FIG. 3 schematically indicates that the optical fiber 110 is provided with an insensitive lead in section 310 and with an actual sensing section 312. For the sake of simplicity, electric cable 102, which forms part of the arrangement 150 according to FIG. 3, and which is intimately vibrationally coupled to and aligned with the optical fiber 110, is not shown in FIG. 3. A portion of the electromagnetic radiation which does not propagate through the actual sensing section 312 is detected in a first detector 314 (such as a Michelson detector). Another portion of the electromagnetic radiation which propagates through the actual sensing section 312 is detected in a second detector 316 (such as a Mach-Zehnder detector). The respective detected signals pass a respective filter 318, 320 (such as a low pass filter), are digitized in analog to digital converter 208 and are interferometrically analyzed and compared in the partial discharge determining unit 112 to derive the information indicative of parts or discharge events in the electric cable 102 (not shown). The result of the partial discharge detection may be output to a user via input/output unit 161.

Figure 4:
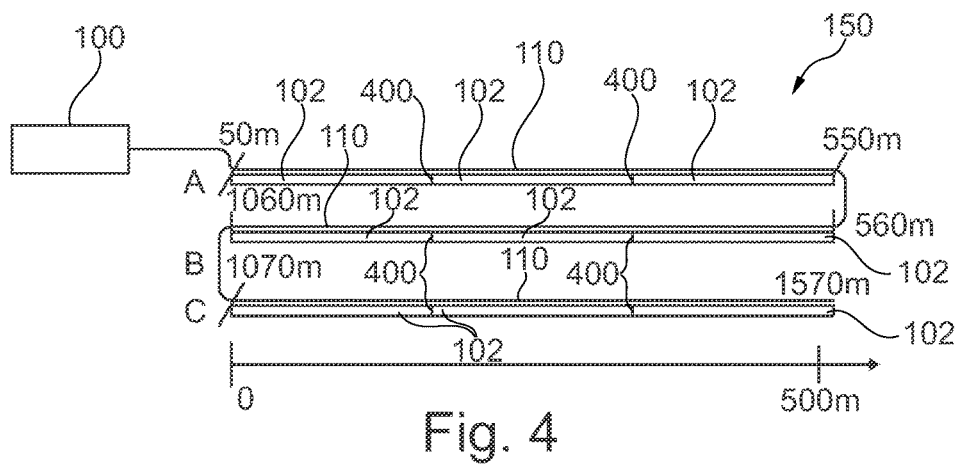

FIG. 4 illustrates an arrangement 150 with a device 100 for detecting partial discharge in an electric cable 102 according to yet another exemplary embodiment of the invention.

The electric cable 102 is here a three-phase cable having three sub cables (see A, B, C) each assigned to a respective phase, and a bent single fiber 110 is provided, wherein each of three sections of the single fiber 110 is aligned along a respective one of the three sub cables (see A, B, C). FIG. 4 hence illustrates how different sections of an optical fiber 110 can be aligned along different phase units A, B and C of the electric cable 102. Reference numeral 400 illustrates connection positions at which different cable portions are connected to one another.

The position of the events within the optical fiber 110 are mapped to the position along the electric cable 102 by a mapping scheme, which maps optical distance to electrical phase and distance. A special feature of this mapping is the reversal of the direction in intermediate part of the fiber 110. This is shown in Table 1:

TABLE 1 mapping between fiber position and cable position

| Fiber [m] | Electric Cable [m] |
|---|---|
| 50-550 | A: 0-500 |
| 560-1060 | B: 500-0 (reversal) |
| 1070-1570 | C: 0-500 |

Figure 5:
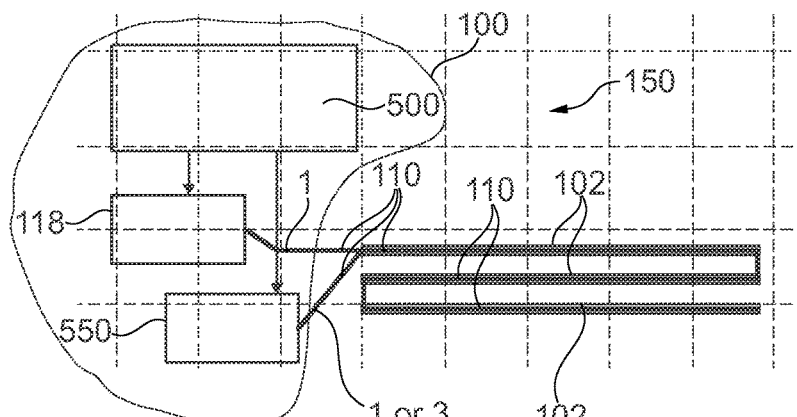

FIG. 5 illustrates an arrangement 150 with a device 100 for detecting partial discharge in an electric cable 102 according to exemplary embodiment of the invention. A block 550 can for instance be a DAS device (see for instance FIG. 2) or a DVS device (see for instance FIG. 3). A DTS unit is provided as well (see reference numeral 118).

According to FIG. 5, the fiber 110 is used for determining information indicative of the partial discharge and is used for determining the temperature information. FIG. 5 therefore illustrates the combination of DTS for temperature sensing/ampacity rating on the one hand and DAS/DVS for partial discharge determination on the other hand.

In many cases, the relationship to the electrical phase is not known, but this might not be necessary. Optionally, an additional electrical sensor (not shown) can be used to measure the electrical phase.

The optical fiber 110 covers all three sub cables of the three phases of the power cable circuit. Because all three fibers sections need to be measured simultaneously, either three DAS or DVS units are used, which is usually not efficient. The optical fiber 110 of the three different sub cables can be spliced together in a way that they form a sensor along each phase of cable system, as long as the length of one phase does not exceed one third of the measurement range of the measurement apparatus. This way the whole cable system can be monitored by using one DAS or DVS unit with measuring all three phases at once.

Figure 6:
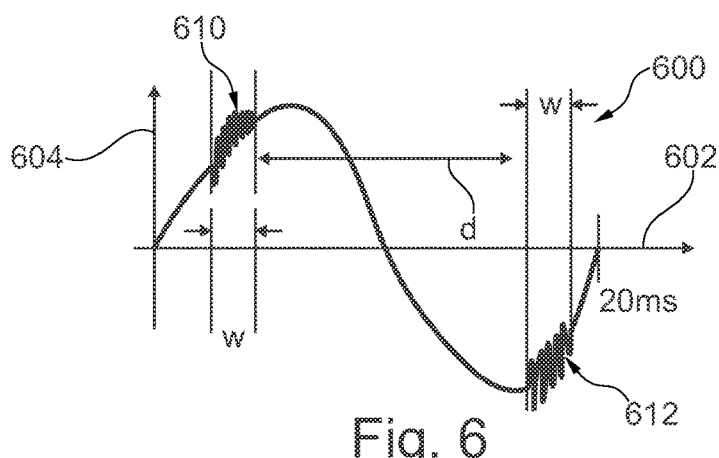
FIG. 6 illustrates a diagram showing a time dependence of a signal detected by an optical fiber-based sensor of a device according to an exemplary embodiment in response to a partial discharge event in an electric cable in functional mechanical connection with the optical fiber.

FIG. 6 illustrates a diagram 600 showing a time dependence of a signal detected by an optical fiber-based sensor of a device 100 according to an exemplary embodiment in response to a partial discharge event in an electric cable 102 in functional connection with the optical fiber 110.

Diagram 600 has an abscissa 602 along which the time is plotted. Along an ordinate 604, a detection signal as detected by the device 100 is plotted. As can be taken from FIG. 6, a partial discharge event 610 occurs having a width w on the time scale. Furthermore, a distance d between two subsequent partial discharge events 610, 612 may be determined. These parameters in combination are indicative of a necessity or non-necessity of maintaining or replacing an electric cable 102 in which the partial discharge events 610, 612 occur.

The detected partial discharge events are statistically evaluated where and how often they occur and binned to give a reading as pulses per second [pps] as a measure of the partial discharge. The time distance d and the signal strength of these events are also measures of the strength of the partial discharge. Another measure is the width w of the partial discharge signal within the period of the voltage.

The distance d in an electric cable 102 in good condition is around 9 ms to 10 ms. If the distance d goes for example below 5 ms, an alarm is generated. If the distance d is less than 2 ms, the system can go any time into a fault.

A visualization or cable management system can collect these measurement results online and store them in a database, showing trends and giving a pre-alarm or alarm, if a certain partial discharge level is exceeded.

When carrying out a method of detecting partial discharge in an electric cable 102 according to an exemplary embodiment or when programming a corresponding program element according to an exemplary embodiment, an algorithm for such a system according to an exemplary embodiment can be summarized as follows.

When the device 100 is configured to operate in accordance with DAS, the device 100 generates intensity data versus distance for the optical fiber 110:
  a) Signal detection at position x_i
  b) Position monitoring of x_i for some time (for instance in the millisecond range)
  c) Signal analysis/pattern detection (in particular identifying one or more partial discharge events at position x_i)
  d) Classification of the detected signal (for instance accepting or rejecting the signal as a partial discharge event, assigning a confidence level, etc.)

e) Repetition detection of event (in particular identifying one or more later partial discharge events at position x_i)

f) Calculation of the signal distance d (between the earlier identified event and the later identified event)

Based on the analysis of the results of the steps c) to f) of the operation in accordance with DAS the system may give at least one alarm, which may be recognized by a user. The information on which the alarm is based may be detected by the partial discharge determining unit. The given alarm may be an absolute alarm value of the signal parameter (i.e. and the measured value of the signal parameter may be greater than a given alarm threshold) or may be a rate of change of the measured value of the signal parameter (i.e. the measurement value of the signal parameter increased more than a given alarm threshold within a predefined time interval). More in particular, the alarm may be based on at least one of the following signal parameters of the determined information: an amplitude, a distance d, a width w, a density, and a confidence value. In FIG. 6 the distance d, the width w and the amplitude of an example signal is illustrated.

For avoiding false alarms, the existence of the necessity of the alarm may be verified. For example before the alarm may be generated, the verification may be conducted by considering a confirmation of a counter N, which based on the implementation of the counter N may count up or down. For example the counter may confirm at least N=1 or more repetitions of the event for verifying the alarm. If N=0 the alarm may be generated directly.

When the device 100 is configured to operate in accordance with DVS, the device 100 may generate two pieces of information: event type and position (i.e. spatial position along the extension of the fiber 110), both with a confidence level, and which in combination gives an event:

a) Classification of the detected signal (for instance accepting or rejecting the signal as a partial discharge event, assigning a confidence level, etc.)

b) Repetition detection of this event (i.e. detecting a further partial discharge event at a later point of time)

c) Calculation of the signal distance d (between the earlier identified event and the later identified event)

Based on the analysis of the results of the steps a) to c) of the operation in accordance with DVS the system may give at least one alarm, which may be recognized by a user. The information on which the alarm is based may be detected by the partial discharge determining unit. The given alarm may be an absolute alarm value of the signal parameter (i.e. and the measured value of the signal parameter may be greater than a given alarm threshold) or may be a rate of change of the measured value of the signal parameter (i.e. the measurement value of the signal parameter increased more than a given alarm threshold within a predefined time interval). More in particular, the alarm may be based on at least one of the following signal parameters of the determined information: an amplitude, a distance d, a width w, a density, and a confidence value. In FIG. 6 the distance d, the width w and the amplitude of an example signal are illustrated.

For avoiding false alarms, the existence of the necessity of the alarm may be verified. For example before the alarm may be generated, the verification may be conducted by considering a confirmation of a counter N, which based on the implementation of the counter N may count up or down. For example the counter may confirm at least N=1 or more repetitions of the event for verifying the alarm. If N=0 the alarm may be generated directly.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A device for detecting partial discharge in an electric cable, the device comprising:
   an electromagnetic radiation source configured for generating primary electromagnetic radiation to be coupled into at least one fiber at least a part of which being aligned along and motionally coupled with the electric cable, wherein a corresponding section of the fiber follows the mechanical motion of the electric cable;
   an electromagnetic radiation detector configured for detecting secondary electromagnetic radiation generated in the at least one fiber in response to the coupling of the primary electromagnetic radiation into the at least one fiber and being influenced by partial discharge induced local motion of the electric cable, which local motions couple to the at least one fiber; and
   a partial discharge determining unit configured for determining information indicative of the partial discharge in the electric cable based on an analysis of the motionally influenced secondary electromagnetic radiation detected by the electromagnetic radiation detector considering an influence of the partial discharge induced local motions and regardless of electromagnetic radiation generated in or around the electric cable due to the partial discharge.

2. The device according to claim 1, wherein the device is configured for detecting the partial discharge in the electric cable by Distributed Acoustic Sensing.

3. The device according to claim 1, wherein the device is configured for detecting the partial discharge in the electric cable by Distributed Vibration Sensing.

4. The device according to claim 1, further comprising:
   a temperature information determining unit configured for determining temperature information along an extension of the electric cable by Distributed Temperature Sensing based on an analysis of secondary electromagnetic radiation detected in response to the primary electromagnetic radiation.

5. The device according to claim 2, further comprising:
   an alarm unit for providing an alarm based on the information indicative of the partial discharge.

6. The device according to claim 4, wherein the fiber used for determining information indicative of the partial discharge and the fiber used for determining the temperature information are at least partially the same fiber.

7. The device according to claim 1, wherein the partial discharge determining unit is configured for determining the information indicative of the partial discharge exclusively considering the influence of the partial discharge induced local motions.

8. The device according to claim 1, wherein the partial discharge determining unit is configured for determining positional information indicative of a position along the electric cable at which the partial discharge has occurred.

9. The device according to claim 1, wherein the partial discharge determining unit is configured for determining the information indicative of the partial discharge based on a pattern analysis of one or more features of the secondary electromagnetic radiation.

10. The device according to claim 1, wherein the partial discharge determining unit is configured for determining information indicative of a time distance between subsequent partial discharge events at a certain position of the electric cable and the fiber.

11. The device according to claim 1, wherein the partial discharge determining unit is configured for determining information indicative of a time duration of a partial discharge event at a certain position of the electric cable and the fiber.

12. The device according to claim 1, wherein the partial discharge determining unit is configured for determining spatially resolved information indicative of the partial discharge at a certain cable position of the electric cable based on an identification of a certain fiber position of the fiber to which a detected portion of the secondary electromagnetic radiation belongs and based on predetermined mapping information mapping cable positions to fiber positions.

13. An arrangement, comprising:
an electric cable;
at least one fiber at least a part of which being aligned along and motionally coupled with the electric cable, wherein a corresponding section of the fiber follows the mechanical motion of the electric cable;
a device for detecting partial discharge in the electric cable based on an analysis of motionally influenced electromagnetic radiation detected by an electromagnetic radiation detector, the electromagnetic radiation generated in the at least one fiber in response to coupling of electromagnetic radiation into the at least one fiber and influenced by partial discharge induced motion considering an influence of the partial discharge induced local motions and regardless of electromagnetic radiation generated in or around the electric cable due to the partial discharge.

14. The arrangement according to claim 13, wherein the at least one fiber is provided separately from the electric cable.

15. The arrangement according to claim 13, wherein both the fiber and the electric cable are embedded within a common sheathing, or wherein the fiber is embedded directly within a conductor of the electric cable.

16. The arrangement according to claim 13, wherein at least the part of the fiber is acoustically coupled with the electric cable.

17. The arrangement according to claim 13, further comprising:
a shielding provision for shielding the fiber so as to disable electromagnetic radiation generated in the electric cable by partial discharge from propagating into the fiber.

18. The arrangement according to claim 13, wherein the fiber is a single mode fiber.

19. The arrangement according to claim 13, wherein the electric cable is a multi-phase cable having multiple sub cables each assigned to a respective phase, and multiple fibers are provided,
wherein at least a part of each of the multiple fibers is aligned along a respective one of the sub cables.

20. A method of detecting partial discharge in an electric cable, the method comprising:
coupling primary electromagnetic radiation into at least one fiber at least a part of which being aligned along and motionally coupled with the electric cable, wherein a corresponding section of the fiber follows the mechanical motion of the electric cable;
detecting secondary electromagnetic radiation generated in the at least one fiber in response to the coupling of the primary electromagnetic radiation into the at least one fiber and being influenced by partial discharge induced local motions of the electric cable, which local motions couple to the at least one fiber; and
determining information indicative of the partial discharge in the electric cable based on an analysis of the motionally influenced detected secondary electromagnetic radiation considering an influence of the partial discharge induced local motions regardless of electromagnetic radiation generated in or around the electric cable due to the partial discharge.

21. An arrangement, comprising:
an electric cable;
at least one fiber at least a part of which being aligned along and vibrationally coupled with the electric cable; and
a device arranged with
a source for generating primary electromagnetic radiation to be coupled into the at least one fiber,
a detector configured for detecting secondary electromagnetic radiation generated in the at least one fiber in response to the coupling of the primary electromagnetic radiation into the at least one fiber and being influenced by partial discharge induced local motion of the electric cable, and
a determining unit configured for determining information indicative of the partial discharge in the electric cable based on an analysis of the vibrationally influenced secondary electromagnetic radiation detected by the detector considering an influence of the partial discharge induced local motions and regardless of electromagnetic radiation generated in or around the electric cable due to the partial discharge;
wherein a position of the partial discharge event within the fiber is mapped to the position along the electric cable by a mapping scheme.

22. A method of detecting partial discharge events in an electric cable, the method, comprising:
coupling primary electromagenetic radiation into at least one fiber at least part of which being aligned along and vibrationally coupled with the electric cable;
detecting secondary electromagnetic radiation generated in the at least one fiber in response to the coupling of the primary electromagnetic radiation into the at least one fiber and being influenced by partial discharge event induced local vibration of the electric cable, which local vibration couples to the at least one fiber;
determining a width of each partial discharge event on a time scale;
determining a distance between a pair of two subsequent partial discharge events on a time scale;
statistically evaluating the determined width and the determined distance; and
determining the strength of the partial discharge events based on the statistical evaluation.

* * * * *